(12) United States Patent
Kim et al.

(10) Patent No.: US 10,595,413 B2
(45) Date of Patent: Mar. 17, 2020

(54) BOARD HAVING ELECTRONIC ELEMENT, METHOD FOR MANUFACTURING THE SAME, AND ELECTRONIC ELEMENT MODULE INCLUDING THE SAME

(71) Applicant: SAMSUNG ELECTRO-MECHANICS CO., LTD., Suwon-si (KR)

(72) Inventors: Se Jong Kim, Suwon-si (KR); Won Gi Kim, Suwon-si (KR); Thomas A Kim, Suwon-si (KR); Jeong Hae Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 15/488,081

(22) Filed: Apr. 14, 2017

(65) Prior Publication Data
US 2018/0063961 A1 Mar. 1, 2018

(30) Foreign Application Priority Data

Aug. 25, 2016 (KR) .................. 10-2016-0108587

(51) Int. Cl.
*H05K 1/18* (2006.01)
*H01L 23/367* (2006.01)
(Continued)

(52) U.S. Cl.
CPC ......... *H05K 1/186* (2013.01); *H01L 23/3675* (2013.01); *H01L 23/3677* (2013.01);
(Continued)

(58) Field of Classification Search
CPC . H01L 23/5389; H01L 21/4857; H05K 1/183; H05K 1/185; H05K 1/186;
(Continued)

(56) References Cited

U.S. PATENT DOCUMENTS 5,831,825 A * 11/1998 Fromont ............. H01L 23/3677
361/719
6,400,573 B1 * 6/2002 Mowatt ............... H01L 23/5383
174/252

(Continued)

FOREIGN PATENT DOCUMENTS

| CN | 1407848 A | 4/2003 |
|---|---|---|
| DE | 38 32 856 A1 | 3/1990 |

(Continued)

OTHER PUBLICATIONS

Chinese Office Action dated Jun. 26, 2019 in corresponding Chinese Patent Application No. 201710377105.2 (9 pages in English, 6 pages in Chinese).

*Primary Examiner* — James Wu
*Assistant Examiner* — Michael A Matey
(74) *Attorney, Agent, or Firm* — NSIP Law

(57) ABSTRACT

A printed circuit board includes a board portion and an electronic element. The board portion includes a first substrate having an element accommodating portion and second substrates laminated on outer surfaces of the first substrate. The electronic element is disposed in the element accommodating part. The electronic element includes a heat generating element and a heat radiating member coupled to an inactive surface of the heat generating element.

7 Claims, 7 Drawing Sheets

(51) Int. Cl.
*H03F 3/21* (2006.01)
*H01L 23/373* (2006.01)
*H05K 3/46* (2006.01)
*H05K 3/00* (2006.01)
*H05K 3/02* (2006.01)
*H03F 1/30* (2006.01)
*H05K 1/02* (2006.01)
*H01L 23/538* (2006.01)

(52) U.S. Cl.
CPC ...... *H01L 23/3736* (2013.01); *H01L 23/5389* (2013.01); *H03F 1/30* (2013.01); *H03F 3/21* (2013.01); *H05K 1/0203* (2013.01); *H05K 1/0204* (2013.01); *H05K 3/0044* (2013.01); *H05K 3/02* (2013.01); *H05K 3/4611* (2013.01); *H05K 3/4697* (2013.01); *H01L 2224/16225* (2013.01); *H01L 2224/18* (2013.01); *H01L 2924/181* (2013.01); *H03F 2200/447* (2013.01); *H05K 1/0209* (2013.01); *H05K 3/005* (2013.01); *H05K 3/0032* (2013.01); *H05K 3/4644* (2013.01); *H05K 2203/0191* (2013.01)

(58) Field of Classification Search
CPC .... H05K 3/0061; H05K 3/4697; H05K 1/021; H05K 2201/10416; H05K 3/4644; G06F 1/16
See application file for complete search history.

(56) References Cited

U.S. PATENT DOCUMENTS

| | | | | |
|---|---|---|---|---|
| 6,449,158 | B1* | 9/2002 | Wang | H01L 23/3735 165/185 |
| 7,639,473 | B2* | 12/2009 | Hsu | H01L 23/5389 174/260 |
| 8,130,507 | B2* | 3/2012 | Origuchi | H01L 23/49838 174/260 |
| 8,895,380 | B2* | 11/2014 | Lin | H01L 21/50 438/197 |
| 9,706,639 | B2* | 7/2017 | Lee | H05K 1/0209 |
| 2002/0196608 | A1 | 12/2002 | Kim et al. | |
| 2003/0002260 | A1* | 1/2003 | Hasebe | H01L 23/142 361/720 |
| 2003/0169575 | A1* | 9/2003 | Ikuta | H01L 23/3677 361/761 |
| 2006/0180344 | A1* | 8/2006 | Ito | H01L 23/5385 174/262 |
| 2007/0096292 | A1* | 5/2007 | Machida | H01L 21/4857 257/700 |
| 2008/0277150 | A1* | 11/2008 | Takashima | H01L 21/4857 174/260 |
| 2009/0283299 | A1* | 11/2009 | Suzuki | H05K 1/0207 174/251 |
| 2009/0301766 | A1 | 12/2009 | Park et al. | |
| 2010/0025082 | A1* | 2/2010 | Sasaoka | H05K 1/0206 174/252 |
| 2010/0244230 | A1* | 9/2010 | Oi | H01L 21/6835 257/692 |
| 2010/0288535 | A1* | 11/2010 | Hong | H01L 23/5389 174/252 |
| 2012/0043127 | A1* | 2/2012 | Lin | H05K 1/0203 174/266 |
| 2012/0181696 | A1* | 7/2012 | Sun | H01L 21/486 257/758 |
| 2012/0281379 | A1* | 11/2012 | Shimada | H01L 21/486 361/782 |
| 2012/0319254 | A1* | 12/2012 | Kikuchi | H01L 23/5389 257/659 |
| 2013/0027896 | A1* | 1/2013 | Lee | H05K 1/185 361/761 |
| 2013/0228362 | A1* | 9/2013 | Berkel | H01L 23/36 174/252 |
| 2014/0126156 | A1* | 5/2014 | Naganuma | H05K 1/0206 361/719 |
| 2014/0133103 | A1* | 5/2014 | Nakamura | H01L 23/3735 361/712 |
| 2014/0144677 | A1* | 5/2014 | Wang | H05K 1/0206 174/252 |
| 2014/0262447 | A1* | 9/2014 | Katsuda | H05K 1/185 174/251 |
| 2015/0003020 | A1* | 1/2015 | Hong | H01L 23/5389 361/707 |
| 2015/0189751 | A1* | 7/2015 | Akahoshi | H05K 3/427 174/262 |
| 2015/0189757 | A1 | 7/2015 | Kim et al. | |
| 2015/0255380 | A1* | 9/2015 | Chen | H01L 23/49568 361/707 |
| 2016/0050771 | A1* | 2/2016 | Yu | H05K 3/4644 29/852 |
| 2016/0143129 | A1* | 5/2016 | Min | H05K 1/0206 174/252 |
| 2016/0270227 | A1* | 9/2016 | Wu | H05K 1/0204 |
| 2016/0309575 | A1* | 10/2016 | Min | H05K 3/46 |
| 2016/0351549 | A1* | 12/2016 | Lin | H01L 25/50 |
| 2017/0025393 | A1* | 1/2017 | Lin | H01L 25/0657 |
| 2017/0141744 | A1* | 5/2017 | Kim | H03F 3/195 |
| 2017/0243803 | A1* | 8/2017 | Lin | H01L 23/13 |

FOREIGN PATENT DOCUMENTS

| | | |
|---|---|---|
| KR | 10-0965339 B1 | 6/2010 |
| KR | 10-2012-0077872 A | 7/2012 |
| KR | 10-2015-0079189 A | 7/2015 |

* cited by examiner

S31

S32

S33

BOARD HAVING ELECTRONIC ELEMENT, METHOD FOR MANUFACTURING THE SAME, AND ELECTRONIC ELEMENT MODULE INCLUDING THE SAME

CROSS-REFERENCE TO RELATED APPLICATION

This application claims benefit under 35 USC 119(a) of Korean Patent Application No. 10-2016-0108587, filed on Aug. 25, 2016 in the Korean Intellectual Property Office, the disclosure of which is incorporated herein by reference for all purposes.

BACKGROUND

1. Field

The present disclosure relates to a board having an electronic element, a method of manufacturing the same, and an electronic element module including the same.

2. Description of Related Art

Due to the demand for miniaturization and lightness of electronic device products, printed circuit boards (PCB) with embedded electronic elements, such as a semiconductor element, are being developed.

The board having an embedded electronic element is usually manufactured by forming a cavity in a substrate, positioning the electronic element in the cavity, and then fixing the electronic element in the cavity using a filling material.

Conventionally, heat generated from the embedded electronic element in the PCB is radiated through a via that serves to convey the generated heat. However, due to the size of the via and the heat emission path being very narrow, there is a limit to how much heat can be continuously radiated.

Therefore, a structure capable of smoothly and continuously radiating the heat of the electronic element embedded in the board is needed.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a printed circuit board includes a board portion and an electronic element. The board portion includes a first substrate having an element accommodating portion and second substrates laminated on outer surfaces of the first substrate. The electronic element is disposed in the element accommodating part. The electronic element includes a heat generating element and a heat radiating member coupled to an inactive surface of the heat generating element.

The electronic element may have a thickness thicker than that of the first substrate.

The electronic element may have a portion of the heat radiating member disposed in the second substrates.

The board portion may further include wiring layers. The heat radiating member may be directly coupled to one of the wiring layers disposed on a lowest portion of the board portion.

The wiring layer disposed on the lowest portion of the board portion may include a heat radiating pad disposed below the heat radiating member and surface-bonded to the heat radiating member, and connection pads.

The heat generating element may be a power amplifier, and the heat radiating member may be a heat sink formed of copper material.

The first substrate may be formed by laminating insulating layers, and a wiring layer may be formed between each of the insulating layers.

In another general aspect, a method of manufacturing a printed circuit board having an electronic element, the method includes forming a first substrate by laminating a plurality of insulating layers; forming an element accommodating portion having a through-hole formed in the first substrate; disposing a heat generating element, to which a heat radiating member is bonded, in the element accommodating portion; and forming a second substrate by comprising an insulating layer and a wiring layer on both top and bottom surfaces of the first substrate, wherein the wiring layer comprises a heat radiating pad in surface contact with the heat radiating member.

The forming of the second substrate may include partially removing the insulating layer of the second substrate, to externally expose the heat radiating member.

The partially removing of the insulating layer may include grinding the insulating layer of the second substrate.

The partially removing of the insulating layer may include forming a through-hole in the insulating layer of the second substrate, and the wiring layer may be disposed in the through-hole and is connected to the heat radiating member.

In the disposing of the heat generating element, to which the heat radiating member is bonded, the heat radiating member may be disposed so that a portion thereof protrudes externally from the first substrate.

In the formation of the second substrate, the insulating layer of the second substrate may embed the heat radiating member protruding from the first substrate.

The forming of the first substrate may include forming a metal layer on the insulating layer; and removing the metal layer formed on a region in which the element accommodating portion is to be formed.

An electronic element module includes the printed circuit board having the electronic element; at least one electronic component mounted on the printed circuit board; and a sealing portion sealing the electronic component.

In another general aspect, a multilayer printed circuit board includes an electronic element, a first substrate, an upper second substrate and a lower second substrate. The electronic element includes a heat generating element and a heat radiating member. The first substrate has an element accommodating portion. The electronic element is disposed in the element accommodating portion. The first substrate is disposed between the upper second substrate and the lower second substrate. The lower second substrate includes a heat radiating pad directly coupled to the heat radiating member.

The heat generating element may be a power amplifier and the heat radiating member may be a heat sink.

The lower second substrate and the upper second substrate comprise connection pads.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
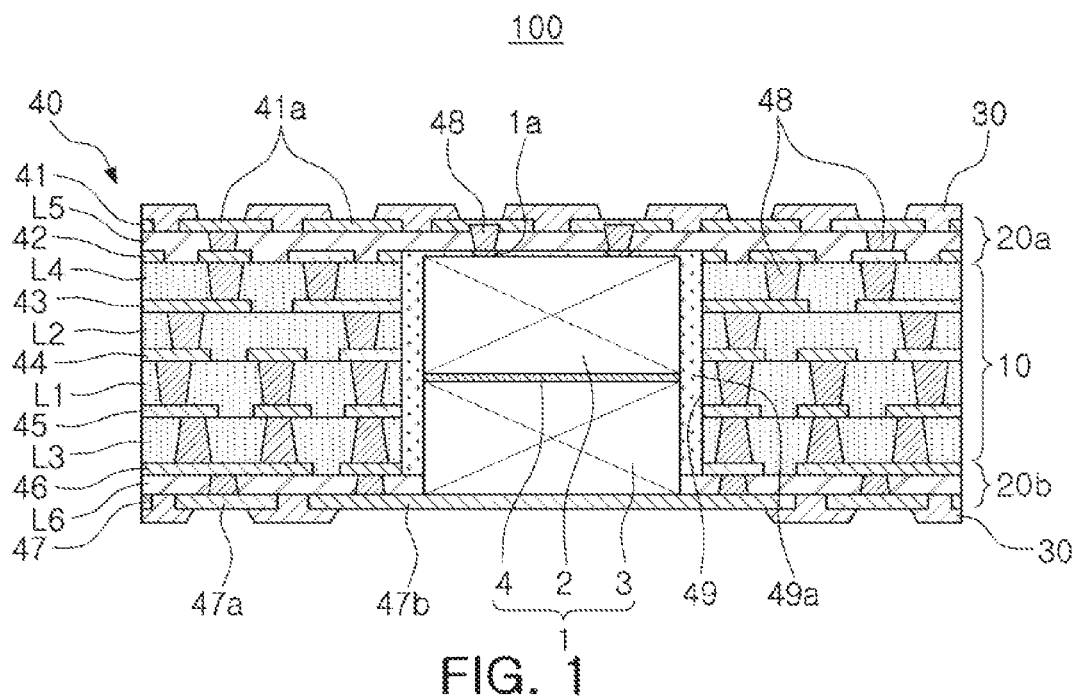
FIG. 1 is a cross-sectional view schematically illustrating an example of a board having an electronic element.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a cross-sectional view schematically illustrating an example of a board having an electronic element.

Referring to FIG. 1, a board 100 having an electronic element includes a board part 40, and at least one electronic element 1 that is embedded in the board part 40.

The board part 40 has a plurality of insulating layers L1 to L6 and wiring layers 41 to 47, which are alternately stacked, and includes an element accommodating part 49.

In addition, the board part 40 is classified into a first substrate 10 including a core, upper second substrate 20a and lower second substrate 20b, stacked on surfaces above and below the first substrate 10, and insulating protective layers 30, stacked on outer surfaces of the upper second substrate 20a and lower second substrate 20b.

The first substrate 10 is disposed in an intermediate portion of the board part 40 and is formed in a multilayer form. The insulating layers L1 to L4 disposed in the first substrate 10 is formed of the same material, but may also be formed of a different material, as needed.

The upper second substrate 20a and lower second substrate 20b are disposed on outer surfaces of the first substrate 10. The insulating layers L5 and L6 configured in the upper second substrate 20a and lower second substrate 20b are formed of the same material, but may also be formed of a different material, as needed.

The insulating protective layer 30 is formed of solder resist. However, the material of the insulating protective layer 30 is not limited thereto.

The insulating protective layers 30 are disposed on the outermost portion of the board part 40 to form surfaces of the board portion 40. In addition, the insulating protective layers 30 include a plurality of openings that externally expose connection pads 41a and 47a or a heat radiating pad 47a.

The upper second substrate 20a includes wiring layers 41 and 42. The wiring layer 41 includes insulating layer L5, connection pad 41a, portions of interlayer connection conductor 48, terminals 1a, and portions of the insulating protective layers 30. The lower second substrate 20b includes wiring layers 46 and 47, insulating layer L6, and interlayer connection conductor 48. The wiring layer 47 includes connection pad 47a, heat radiating pad 47b, and portions of the insulating protective layers 30.

The insulating layers L1 to L6 of the board portion 50 may be formed of a resin material having insulation property. The insulating layers L1 to L6 may be formed of a thermosetting resin such as an epoxy resin, a thermoplastic resin such as polyimide, a resin having a reinforcement material such as glass fiber or inorganic filler impregnated in them, for example, a prepreg. However, the material of the insulating layers is not particularly limited thereto.

The insulating layers L1 to L4 of the first substrate 10 and the insulating layers L5 and L6 of the upper second substrate 20a and lower second substrate 20b may be formed of different materials. For example, the insulating layers L1 to L4 of the first substrate 10 may be formed of a polymer material, and the insulating layers L5 and L6 of the upper second substrate 20a and lower second substrate 20b may be formed of an epoxy material, or vice versa. In addition, various modifications are possible. For example, all of the insulating layers L1 to L6 of the board portion 40 may be formed of the same material.

The wiring layers 41 to 47 are disposed on both top and bottom surfaces of the respective insulating layers L1 to L6.

The wiring layers 41 to 47 are formed by patterning a metal layer such as copper (Cu) foil, but are not necessarily limited thereto.

The connection pads 41a and 47a, for mounting an electronic component 5 (FIG. 1) or a connection terminal 50 (FIG. 2), are formed on the wiring layers 41 and 47 disposed on the outermost portion of the board portion 40. In addition, a heat radiating pad 47b, which is surface-bonded to a heat radiating member 3 to radiate heat of the heat radiating member 3 to the outside, is formed on the wiring layer 47 disposed on the lowest portion of the board portion 40.

As the board portion 40, various kinds of boards (e.g., a ceramic substrate, a printed circuit board, a flexible substrate, etc.), which are well known in the art, may be used.

The board portion 40 is a multilayer board having the plurality of wiring layers 41 to 47. Although the present example illustrates a case in which the board portion 40 includes seven wiring layers 41-47 as an example, the board portion 40 is not limited thereto.

The board portion 40, according to the present example includes an interlayer connection conductor 48 that connects the connection pads 41a and 47a electrically, formed on top and bottom surfaces of the board portion 40, respectively, or the wiring layers 41 to 47, formed in the board portion 40, to each other.

The interlayer connection conductor 48 may have a form that penetrates through any one of the insulating layers L1 to L6.

The element accommodating portion 49, in which at least one electronic element 1 is embedded, is formed in the board portion 40.

The element accommodating portion 49 defining a cavity is formed in the first substrate 10. However, the element accommodating portion 49 is partially extended to or into the upper second substrate 20a and lower second substrate 20b, as needed.

An insulating member 49a is disposed in the element accommodating portion 49. The insulating member 49a is inserted into the element accommodating portion 49, to fill a space between the electronic element 1 and the first substrate 10.

The insulating member 49a has an insulation property, and may be formed of a material which easily fills the element accommodating portion 49. For example, insulating member 49a is formed by filling the element accommodating portion 49 with a B-stage resin or polymer and then curing the element accommodating portion 49, but is not limited thereto.

The electronic element 1 embedded in the element accommodating portion 49 includes a heat generating element 2 and the heat radiating member 3.

The heat generating element 2 is a component that generates a large amount of heat when operated, and may include, for example, a power amplifier. However, the configuration of this example is not limited thereto, and various components may be applied as long as they generate enough heat to require mitigation.

The heat generating element 2 includes an active surface, on which a terminal 1a is formed, and an inactive surface, which is a surface opposite the active surface, and the heat radiating member 3 is bonded to the inactive surface of the heat generating element 2.

The heat radiating member 3 is provided to radiate heat, generated by the heat generating element 2 at the time of the operation of the heat generating element 2, to the outside. The heat radiating member 3 may be formed of a metal material having high thermal conductivity.

According to the present example, the heat radiating member 3 is bonded to the inactive surface of the heat generating element 2 through a bonding portion 4, and may be formed of a copper metal block. The heat radiating member is a passive heat exchanger that transfers the heat generated by the heat generating element 2 to a medium, often air or a liquid coolant, where it is dissipated away from the heat generating element 2. However, the formation of the heat radiating member 3 is not limited thereto, and various modifications are possible to make it function as a heat sink. For example, the heat radiating member 3 is formed by using a metal foil or applying a metal material onto the inactive surface of the heat generating element 2.

The bonding portion 4 bonds and fixes the heat radiating member 3 to the inactive surface of the heat generating element 2, and transfers the heat generated by the heat generating element 2 to the heat radiating member 3. Therefore, any material may be used as the bonding portion 4 as long as it may perform the above-mentioned function.

For example, as the bonding portion 4, a conductive adhesive such as solder paste or a thermal conduction tape may be used, but the bonding portion 4 is not limited thereto.

Meanwhile, as illustrated in FIG. 1, a total height of the electronic element 1, including the heat radiating member 3 and the heat generating element 2, is greater than a thickness of the first substrate 10. Therefore, in a case in which the electronic element 1 is disposed in the element accommodating portion 49, the entirety of the heat generating element 2 is disposed in the first substrate 10, and a portion of the heat radiating member 3 protrudes from the first substrate 10 and be disposed in the upper second substrate 20a and lower second substrate 20b.

As such, the first substrate 10 according to the present example is thick enough to allow the heat generating element 2 to be completely embedded in it. In addition, the heat radiating member 3 is thick enough that one surface thereof may be bonded to the heat generating element 2 and the other surface is bonded to the heat radiating pad 47b.

The board having the electronic element according to the present example and having the configuration described above, may also allow the heat radiating member 3 having a rectangular profile, together with the heat generating element 2, to be embedded in it. In addition, the heat radiating member 3 is directly connected to the heat radiating pad 47b formed on the wiring layer 47, which is disposed on the lowest end of the board portion 40.

Therefore, even though a large amount of heat may be generated from the embedded heat generating element 2, the generated heat is efficiently externally radiated through the heat radiating member 3 and the heat radiating pad 47b.

In a configuration in which a heat radiating path is formed through a conductive via or a wiring pattern, the radiated heat generated by the embedded heat generating element is not efficiently radiated, and, as a result, a component generating a large amount of heat, such as the power amplifier, could not be embedded in the board.

However, in the board including the electronic element according to this example, the heat radiating member 3 is bonded to the entirety or a portion of the inactive surface of the heat generating element 2, and the entirety or a portion of one surface of the heat radiating member 3 and is directly connected to the heat radiating pad 47b. Therefore, since heat radiating efficiency is significantly increased, components generating a large amount of heat can be embedded in the board.

Figure 2:
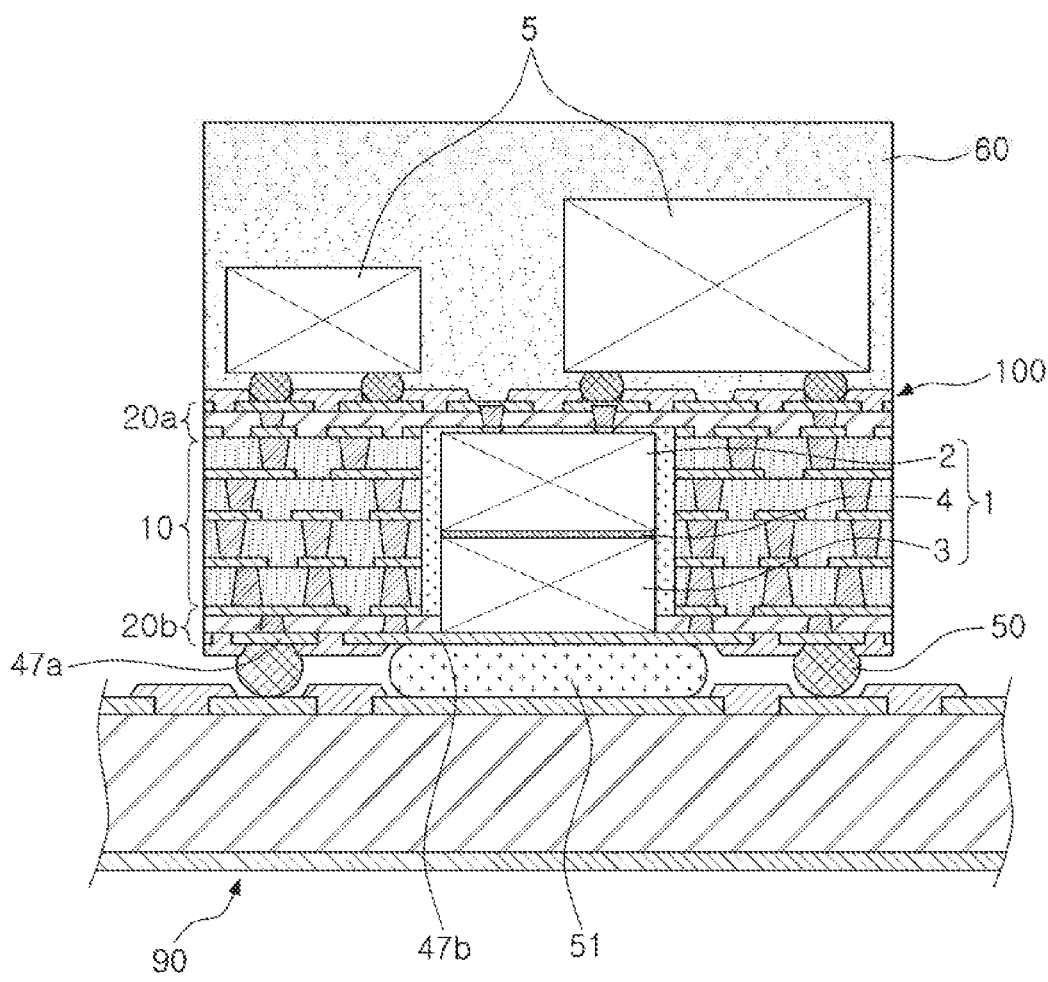
FIG. 2 is a cross-sectional view schematically illustrating an example of an electronic element module, including the board having the electronic element illustrated in FIG. 1.

FIG. 2 is a cross-sectional view schematically illustrating an example of an electronic element module disposed on the board illustrated in FIG. 1.

Referring to FIG. 2, the electronic element module according to the present example includes the board 100 including the electronic element illustrated in FIG. 1, an electronic component 5, a sealing portion 60, and a connection terminal 50.

At least one surface mounted electronic component 5 is mounted on the board 100.

The surface mounted electronic component 5 includes both an active element and a passive element, and may be formed in various sizes and shapes as long as it may be mounted on the board 100, having the electronic element.

The sealing portion 60 seals the electronic component 5 mounted on the board 100. In addition, the sealing portion 60 is filled between the electronic components 5 mounted on the board 100 to prevent a short circuit from occurring between the electronic components 5, and may surround external surfaces of the electronic components 5 while fixing the electronic components 5 onto the board 100 to safely protect the electronic components 5 from external impact.

The sealing portion 60 according to the present example may be formed of an insulating material containing a resin material such as an epoxy molding compound (EMC). However, the material of the sealing portion 60 is not limited thereto.

The connection terminal 50 is bonded to the connection pad 47a disposed on a lower surface of the board 100. The connection terminal 50 connects the electronic element module electrically and physically with a main board 90, on which the electronic element module is mounted. The connection terminal 50 is formed in a form of a solder ball, but is not limited thereto. For example, the connection terminal 50 is formed in various forms such as a bump, a pad, and the like.

In addition, the connection terminal 50 includes at least one heat radiating terminal 51.

The heat radiating terminal 51 connects the heat radiating pad 47b with the main board 90. Therefore, since the heat transferred from the electronic element 1 to the heat radiating member 3 is transferred to the main board 90 through the heat radiating pad 47b and the heat radiating terminal 51, efficiency of the radiated heat is increased through conduction.

Next, a method of manufacturing the board having the electronic element will be described.

FIGS. 3 through 6 are views illustrating an example of a method of manufacturing the board having the electronic element illustrated in FIG. 1.

Figure 3:
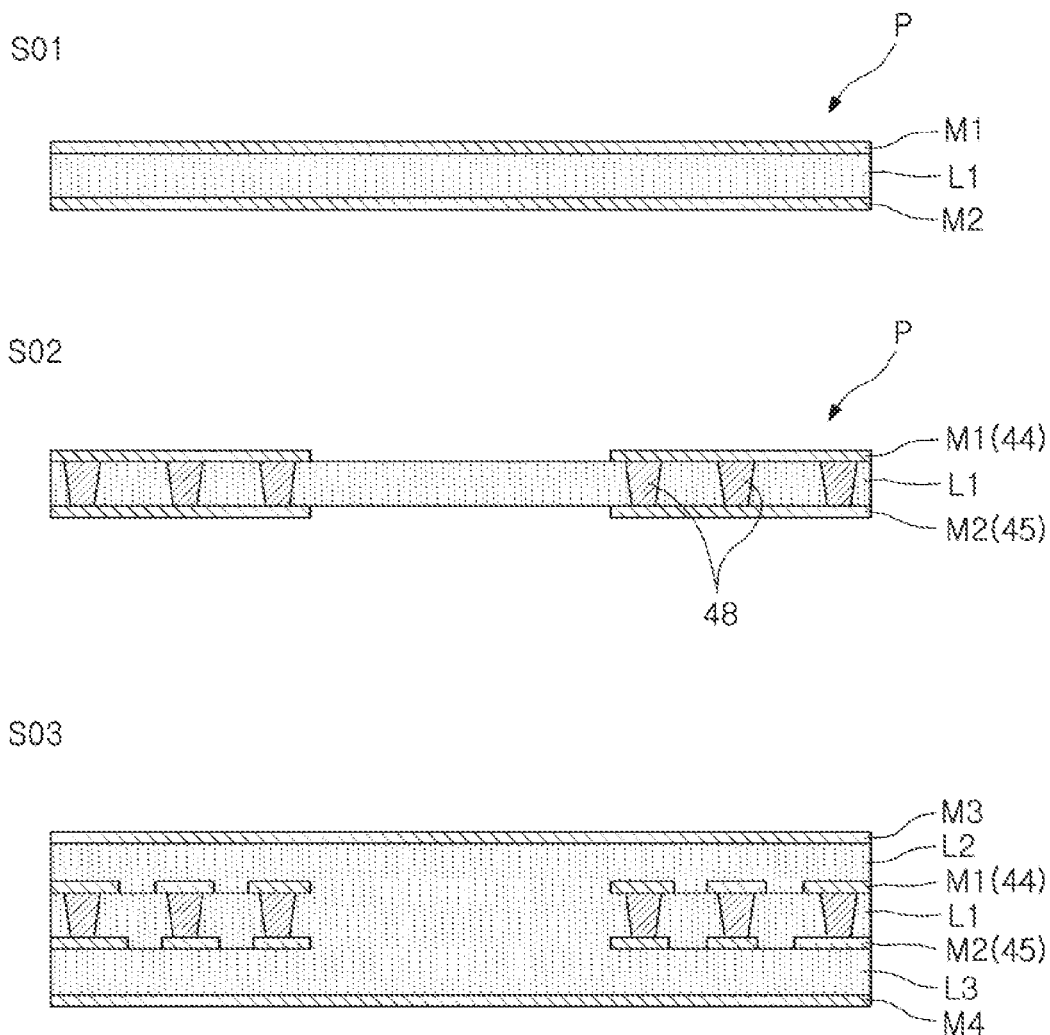
FIGS. 3 through 6 are views illustrating an example of a method of manufacturing the board having the electronic element illustrated in FIG. 1.

Referring to FIGS. 3 through 6, first, as illustrated in FIG. 3, a laminate P, in which metal layers M1 and M2 are formed on upper and lower surfaces of the insulating layer L1, is prepared (S01). For example, a copper clad laminate (CCL) may be used as the above-mentioned laminate.

Next, wiring layers 44 and 45 are formed by patterning the metal layers M1 and M2 on the laminate P (S02). The patterning may be performed by an etching method.

Figure 4:
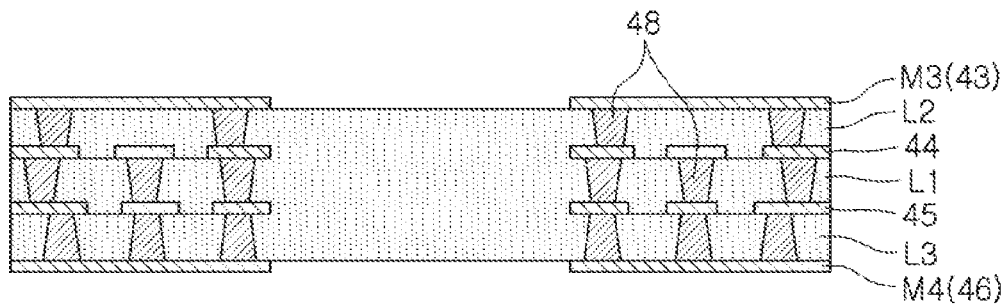
Figure 4:
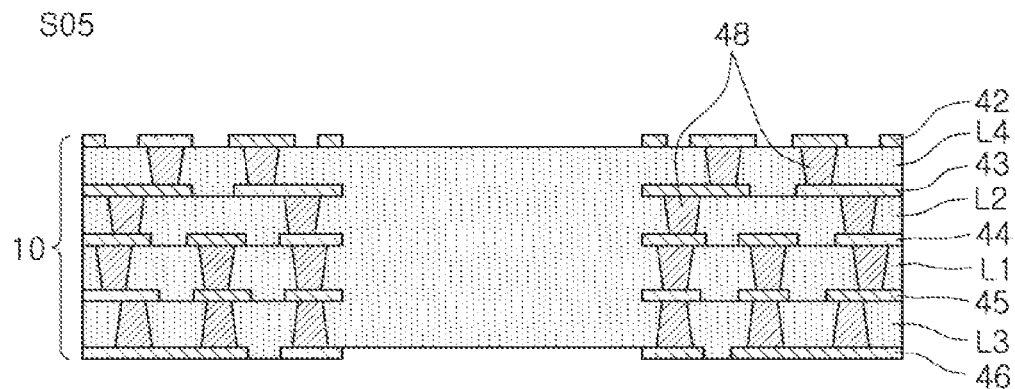
Figure 4:
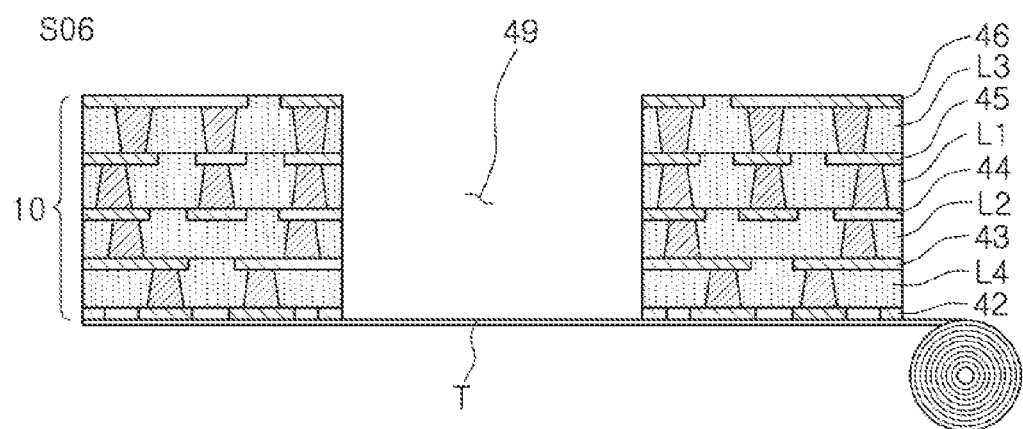

At the same time, a predetermined region of the metal layers M1 and M2 is removed. In this operation, the region from which the metal layers M1 and M2 are removed is subsequently formed as the element accommodating portion 49 (FIG. 4). Therefore, an area of the metal layers M1 and M2 corresponding to the size and shape of the element accommodating portion 49 is removed.

In addition, in the present operation, an interlayer connection conductor 48 is formed on the laminate P. The interlayer connection conductor 48 is formed by forming a through-hole in the insulating layer L1 and then applying or filling a conductive material into the through-hole.

Next, the insulating layers L2 and L3 is laminated on both surfaces of the laminate P, and metal layers M3 and M4 are formed on the insulating layers L2 and L3 (S03). In the present operation, the laminated insulating layers L2 and L3 is formed of the same material as the insulating layer L1 of the laminate P. However, the material of the insulating layers L2 and L3 is not limited thereto.

In addition, the metal layers M3 and M4 may be formed by a method such as plating, deposition, or sputtering.

Next, as illustrated in FIG. 4, the metal layers M3 and M4 is patterned to form wiring layers 43 and 46 and predetermined regions of the metal layers M3 and M4 are removed (S04). In addition, the interlayer connection conductor 48 is respectively formed on the newly laminated insulating layers L2 and L3.

Similarly, the region from which the metal layers M3 and M4 are removed is subsequently formed to define the element accommodating portion 49. Therefore, the area of the metal layers M3 and M4 corresponding to the size and shape of the element accommodating portion 49 is removed.

Next, the first substrate 10 may be prepared to have a required thickness by repeatedly performing the operations (S03 to S04) (S05). The first substrate 10, according to the present example, includes four insulating layers L1, L2, L3, and L4, and five wiring layers 42, 43, 44, 45, and 46.

The first substrate 10 has a thickness thicker than that of the electronic element 1 so that the electronic element 1 is completely embedded in the first substrate 10. In addition, the first substrate 10 may have the thickness which is slightly thinner than a total thickness of the heat radiating member 3 and the heat generating element 2.

Next, a portion of the first substrate 10 is removed to form the element accommodating portion 49, and a tape T for supporting the electronic element 1 is then attached to one surface of the first substrate 10 (S06).

The element accommodating portion 49 may be a through-hole supported by tape T, and has a size corresponding to the size or shape of the embedded electronic element 1.

The wiring layer is not disposed on a region in which the element accommodating portion 49 is to be formed. Therefore, the element accommodating portion 49 is easily formed by removing the insulating layer using a laser. However, the method of forming the element accommodating portion 49 is not limited thereto, but various methods such as a punching method and a drill method may be used, as long as these methods may form the element accommodating portion 49 in the first substrate 10.

Figure 5:
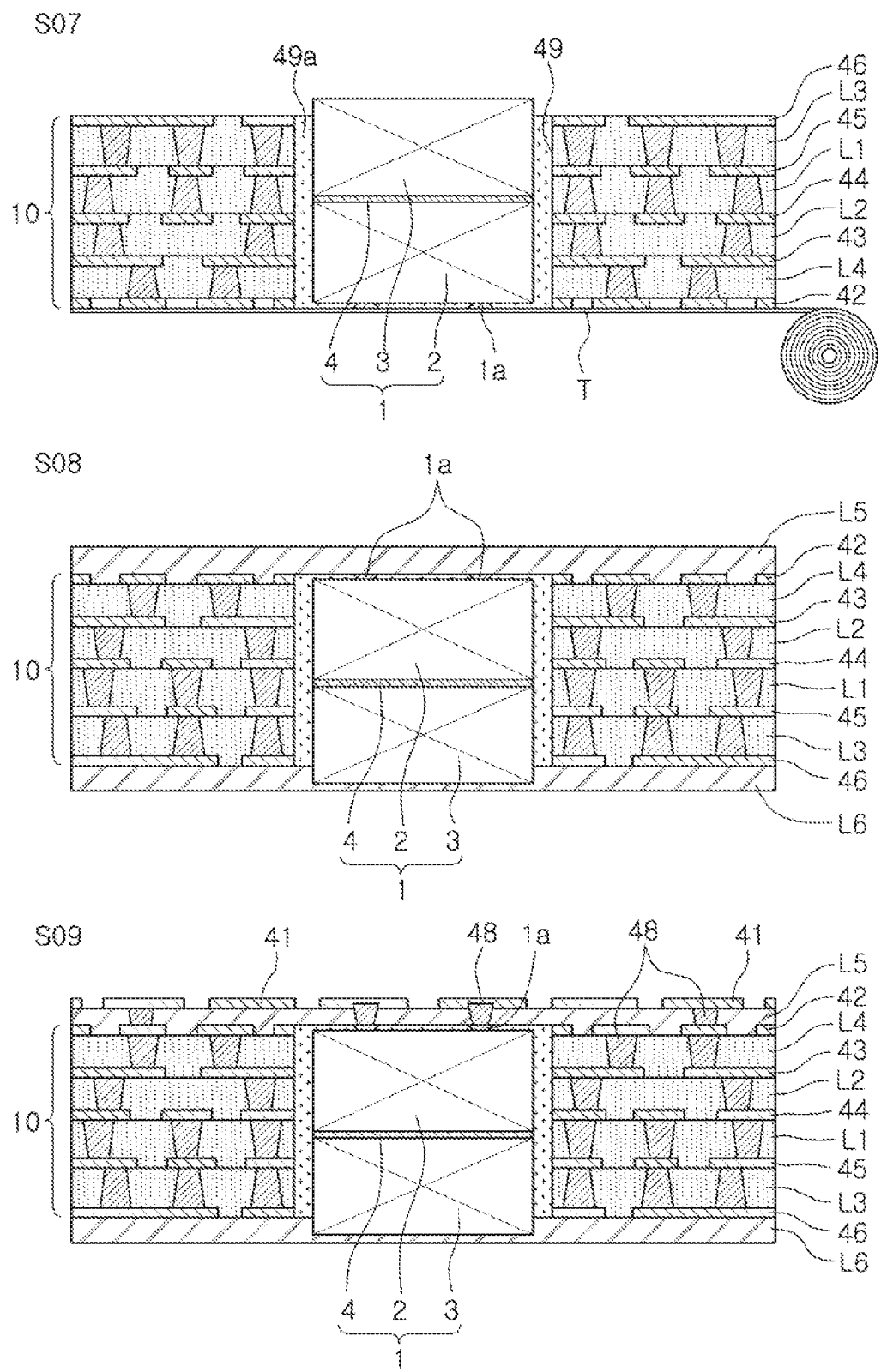

Next, as illustrated in FIG. 5, after the electronic element 1 having a terminal 1a formed on an active surface thereof is disposed in the element accommodating portion 49, the insulating member 49a is formed. In this case, the electronic element 1 is disposed so that the active surface thereof is in contact with the tape T.

As described above, the heat radiating member 3 is bonded to the inactive surface of the heat generating element 2.

According to the present example, a total height of the electronic element 1, including the heat radiating member 3, is thicker than the thickness of the first substrate 10. Therefore, when the electronic element 1 is disposed in the element accommodating portion 49, a portion of the heat radiating member 3 protrudes external of the first substrate 10 from the element accommodating portion 49.

When the electronic element 1 is disposed in the element accommodating portion 49, the insulating member 49a is filled in the element accommodating portion 49 and is then cured. The insulating member 49a is introduced into the element accommodating portion 49 to fill a space formed around the electronic element 1 and to fix the electronic element 1 in position.

The insulating member 49a may be introduced into the element accommodating portion 49 in a liquid or gel form and may then be cured.

Next, after the tape T is removed, insulating layers L5 and L6 is laminated on both top and bottom surfaces of the first substrate 10 (S08). By forming the insulating layers L5 and L6, the electronic element 1 is completely embedded in the first substrate 1 and the insulating layers L5 and L6.

Next, the wiring layer 41 and the interlayer connection conductor 48 are formed on the insulating layer L5 (S09). In the present operation, the wiring layer 41 is formed on only the insulating layer L5, which is disposed to be adjacent to the active surface of the electronic element 1.

The wiring layer 41 includes a plurality of connection pads 41, and the terminals 1a of the electronic element 1 is connected electrically to the wiring layer 41 which is newly formed by the interlayer connection conductor 48.

Figure 6:
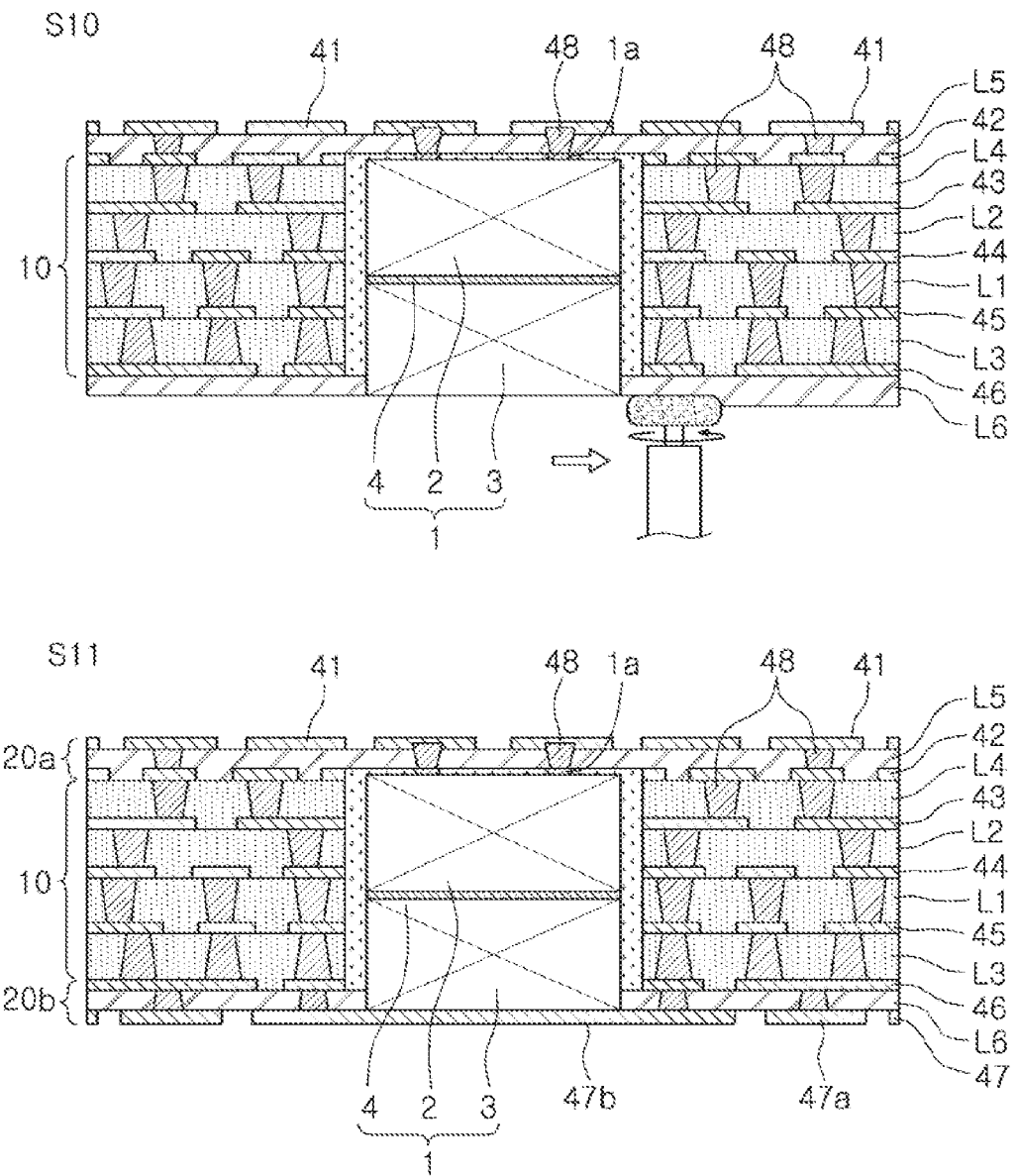

Next, as illustrated in FIG. 6, the heat radiating member 3 is exposed to the outside (S10).

As described in operation (S07), the portion of the heat radiating member 3 is disposed to the outside of the element accommodating portion 49, and, as a result, the protruded portion is disposed in the upper second substrate 20a and lower second substrate 20b.

Therefore, by removing the insulating layer L6 in such a way that the thickness of the insulating layer L6, laminated on the heat radiating member 3, is reduced, the heat radiating member 3 is exposed easily to the outside.

The insulating layer L6 may be removed by grinding the lower surface thereof with a grinder. The insulating layer L6 may be ground and removed until the heat radiating member 3 is exposed, and, as a result, an exposed surface of the heat radiating member 3 is disposed on the same plane as the surface of the insulating layer L6. In addition, the thickness of the insulating layer L6 is equal to the thickness of the heat radiating member 3 that protrudes to the outside of the first substrate 10.

Next, the wiring layer 47 and the interlayer connection conductor 48 is formed on the insulating layer L6 (S011). The wiring layer 47 formed in the present operation includes the connection pad 47a and the heat radiating pad 47b.

As a result, the upper second substrate 20a and lower second substrate 20b respectively disposed on both top and bottom surfaces of the first substrate 10 are completed.

The present example describes a case in which only one layer of the upper second substrate 20a and lower second substrate 20b is respectively disposed on each of top and bottom surfaces of the first substrate 10, as an example. However, the configuration of the examples is not limited thereto. For example, the upper second substrate 20a and lower second substrate 20b may also be formed in a multilayer form by laminating a plurality of insulating layers on the first substrate 10 and forming one wiring layer between each of the plurality of insulating layers.

Although the present example describes a case, as an example, in which the wiring layer 41 is first formed on the upper insulating layer L5 and the wiring layer 47 is then formed on the lower insulating layer L6, the configuration of this example is not limited thereto.

For example, after the lower wiring layer 47 is first formed, the upper wiring layer 41 may be formed. In addition, after the operation (S08) of forming the insulating layers L5 and L6, the operation of forming the through-hole in the insulating layers L5 and L6 and the operation of exposing the heat radiating member 3 may be performed, and the wiring layers 41 and 47 and the interlayer connection conductor 48 may also be formed simultaneously on two insulating layers L5 and L6.

Next, after an insulating protective layer 30 is formed on each of the insulating layers L5 and L6 and the wiring layers 41 and 47, a plurality of openings is formed in the insulating protective layer 30 to complete the board having the electronic element illustrated in FIG. 1.

The insulating protective layer 30 is formed of solder resist. In addition, the insulating protective layer 30 may also be formed in a multilayer form, as needed.

In the method of manufacturing the board having the electronic element according to the present example, having the configuration as described above, after the heat radiating member 3 is exposed by the grinding method, the wiring layer 47 is directly formed on the exposed surface of the heat radiating member 3, and the heat radiating pad 47b is disposed thereon.

As a result, since the heat radiating pad 47b and the heat radiating member 3 are easily connected to each other, the board having the electronic element is manufactured easily. In addition, since a large surface portion of the heat radiating pad 47b and the heat radiating member 3 are bonded to each other, the heat radiating effect is increased.

Figure 7:
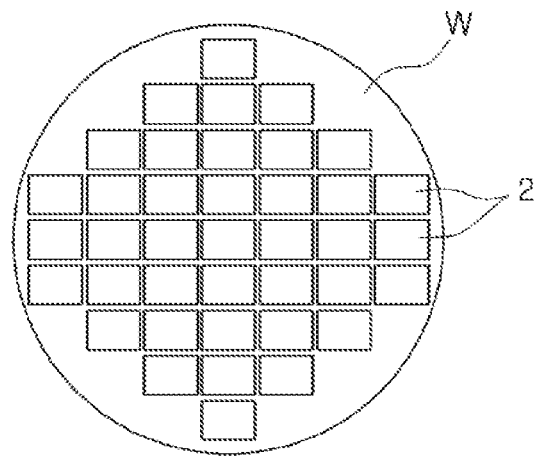
FIG. 7 is a view illustrating an example of a method of manufacturing the electronic element illustrated in FIG. 1.
Figure 7:
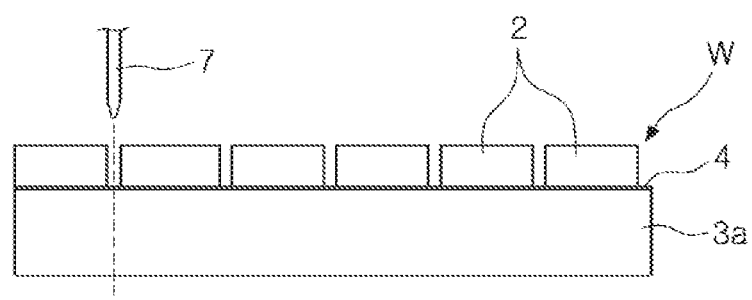
Figure 7:
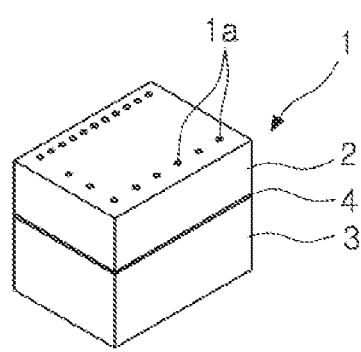

FIG. 7 is a view illustrating an example of a method of manufacturing the electronic element illustrated in FIG. 1.

Referring to FIG. 7, first, a plurality of heat generating elements 2 is formed on a wafer W (S31).

The heat generating element 2 is a component that generates a large amount of heat during operation, and may include, for example, a power amplifier.

The heat generating element 2 may include an active surface on which terminals 1a are formed, and an inactive surface which is a surface opposite the active surface.

Next, a metal plate 3a is bonded to the inactive surface of the heat generating element 2 through a bonding portion 4 (S32). As the bonding portion 4, a solder paste or a thermal conduction tape may be used, but the bonding portion 4 is not limited thereto.

According to the present example, the heat generating elements 2 is bonded to the metal plate 3a in a state in which the heat generating elements 2 are separated from the wafer W. However, the bonding of the heat generating elements 2 to the metal plate 3a is not limited thereto, but the heat generating elements 2 may also be bonded to the metal plate 3a in a state in which the wafer W is not cut and the heat generating elements 2 are integrally formed on the wafer W.

A copper foil or a copper plate may be used as the metal plate 3a but is not limited thereto. For example, various methods, such as applying or depositing a metal material on the inactive surfaces of the heat generating elements 2, may be used.

Next, the metal plate 3a is cut or diced to complete the construction of the electronic element 1 having the heat radiating member 3 (S33). In order to cut the wafer W and the metal plate 3a, a blade 7 or laser may be used.

Although not illustrated, before the cutting operation, an operation of reducing a thickness of the metal plate 3a may be further performed. The present operation may be performed by grinding one surface of the metal plate 3a with a grinder but is not limited thereto.

A board having an electronic element is not limited to the examples described above and may be variously modified.

Figure 8:
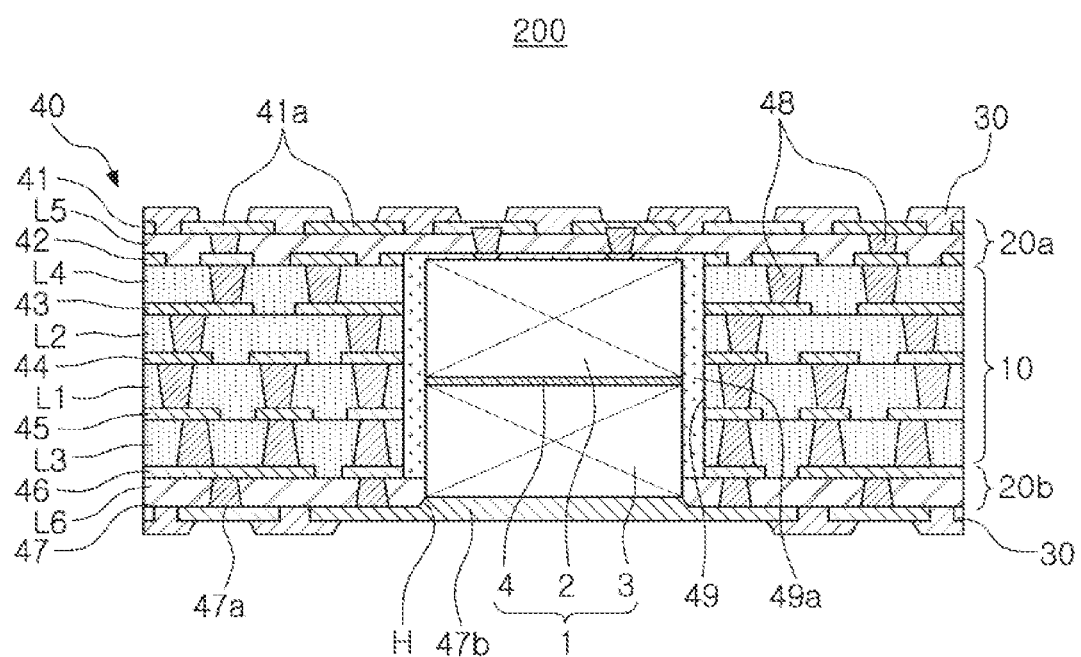
FIG. 8 is a cross-sectional view schematically illustrating another example of a board having an electronic element.

FIG. 8 is a cross-sectional view schematically illustrating an example of a board having an electronic element according to another example.

Referring to FIG. 8, a board 200, having an electronic element according to the present example includes a through-hole H formed in the insulating layer L6 of the lower second substrate 20b, in which the heat radiating member 3 is partially embedded, wherein the heat radiating member 3 is connected to the heat radiating pad 47b through the through-hole H.

Therefore, the through-hole H has a size corresponding to an area of the lower surface of the heat radiating member 3.

In addition, the heat radiating pad 47b is filled in the through-hole H and is connected to the heat radiating member 3.

The board having the electronic element according to the present example is manufactured by forming the through-hole H in the lower insulating layer L6 in the operation (S09) of FIG. 5 and then forming the wiring layer 47 in the through-hole H and on the surface of the insulating layer L6.

In this case, since the grinding operation and removing a portion of the insulating layer L6 is omitted, and the through-hole H is simultaneously formed in the operation of forming the interlayer connection conductor 48, the board having the electronic element is manufactured easily.

As set forth above, according to the examples, the heat radiating member is embedded in the board having the electronic element in a state in which it is attached to the inactive surface of the electronic element, and the heat radiating member is directly connected to the heat radiating pad on the surface of the board. As a result, the heat radiating performance is increased. As a result, the board having the electronic element may have the component giving off a large amount of heat embedded in it.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A printed circuit board, comprising:
   a board portion comprising a first substrate having an element accommodating portion and second substrates laminated on outer surfaces of the first substrate, wherein one of the second substrates includes a wiring layer disposed on an outermost portion of the board portion; and
   an electronic element disposed in the element accommodating portion,
   wherein the electronic element comprises a heat generating element and a heat radiating member, and the heat radiating member includes a first surface coupled to an inactive surface of the heat generating element and a second surface coupled to the wiring layer,
   wherein the heat radiating member is partially disposed in the element accommodating portion of the first substrate and comprises a portion that protrudes from the first substrate and is disposed in and in contact with the one of the second substrates, and
   wherein the wiring layer comprises a heat radiating pad surface-bonded to the heat radiating member and connection pads.

2. The printed circuit board of claim 1, wherein the electronic element has a thickness thicker than that of the first substrate.

3. The printed circuit board of claim 1, wherein the heat generating element is a power amplifier, and
   the heat radiating member is a heat sink formed of copper material.

4. The printed circuit board of claim 1, wherein the first substrate is formed by laminating insulating layers, and
   a wiring layer is formed between each of the insulating layers.

5. An electronic element module, comprising:
   the printed circuit board having the electronic element of claim 1;
   at least one electronic component mounted on the printed circuit board; and
   a sealing portion sealing the electronic component.

6. A printed circuit board, comprising:
   a board portion comprising a first substrate having an element accommodating portion, second substrates laminated on outer surfaces of the first substrate, and a wiring layer disposed on an outermost portion of the board portion; and
   an electronic element disposed in the element accommodating portion, wherein the electronic element comprises a heat generating element and a heat radiating member directly coupled to the wiring layer such that the heat radiating member is disposed between the heat generating element and the wiring layer in a thickness direction of the printed circuit board, wherein a first surface of the heat radiating member is coupled to an inactive surface of the heat generating element and a second surface coupled to the wiring layer, and wherein the wiring layer comprises a heat radiating pad surface-bonded to the heat radiating member, and connection pads.

7. The printed circuit board of claim 6, wherein the electronic element has a thickness thicker than that of the first substrate.

* * * * *